United States Patent [19]

Lehrer

[11] 4,398,335
[45] Aug. 16, 1983

[54] MULTILAYER METAL SILICIDE INTERCONNECTIONS FOR INTEGRATED CIRCUITS

[75] Inventor: William I. Lehrer, Los Altos, Calif.

[73] Assignee: Fairchild Camera & Instrument Corporation, Mountain View, Calif.

[21] Appl. No.: 214,615

[22] Filed: Dec. 9, 1980

[51] Int. Cl.³ .............................................. H01L 21/88
[52] U.S. Cl. .................................... 29/577 C; 29/571; 357/71
[58] Field of Search ................ 29/569 R, 571, 577 C, 29/589; 427/87, 89, 93; 357/59, 67, 71

[56] References Cited

U.S. PATENT DOCUMENTS

| | | | |
|---|---|---|---|
| 3,881,242 | 5/1975 | Nuttall et al. | 427/87 X |
| 3,881,971 | 5/1975 | Greer et al. | 337/71 X |
| 4,128,670 | 12/1978 | Gaensslen | 357/71 X |
| 4,265,935 | 5/1981 | Hall | 357/71 X |
| 4,276,557 | 6/1981 | Levinstein et al. | 357/71 X |
| 4,283,439 | 8/1981 | Higashinakagawa et al. | 427/93 X |

OTHER PUBLICATIONS

IBM Technical Disclosure Bulletin, "Gate for MOS Devices: Rare Earth Silicides", vol. 21, No. 7, Dec. 1978.

*Primary Examiner*—L. Dewayne Rutledge
*Assistant Examiner*—David A. Hey
*Attorney, Agent, or Firm*—Kenneth Olsen; Michael J. Pollock; Carl L. Silverman

[57] ABSTRACT

A process and resulting structure are disclosed for forming vias in integrated circuit structures using metal silicide interconnections. A lower conductor is formed by sequentially depositing silicon and a refractory metal which reacts with the silicon to create a layer of metal silicide. A subsequent layer of silicon is deposited on the surface of the metal silicide. This layer of silicon is insulated from overlying layers by forming insulating material over desired regions of the layer of silicon. A second layer of metal is then deposited across the structure. In openings in the insulating material the metal reacts with the second layer of silicon to form a via of metal silicide. A final layer of silicon may be deposited to convert any remaining metal in the second layer of metal to metal silicide, and the structure annealed to lower its resistivity.

15 Claims, 4 Drawing Figures

MULTILAYER METAL SILICIDE INTERCONNECTIONS FOR INTEGRATED CIRCUITS

BACKGROUND OF THE INVENTION

1. Field of the Invention

This invention relates to electrical interconnections in integrated circuit structures, and in particular, to a process for forming interconnections between layers of electrically conductive material in integrated circuit structures.

2. Prior Art

Most integrated circuit manufacturing operations have relied upon aluminum or alloys of aluminum with copper or other materials for fabricating the interconnections between regions on the surface of an integrated circuit structure. The technology for fabricating such interconnections using aluminum is well known. Numerous techniques are also known for forming "vias" which are used to connect an underlying conductive layer to an overlying conductive layer otherwise separated by an intervening region of insulating material.

Unfortunately, aluminum interconnections in integrated circuit structures suffer from several disadvantages. Aluminum lines are prone to electromigration as the electric current flowing through the aluminum conductor progressively shifts aluminum atoms from one location to another, eventually causing failure of the connecting line. In addition, aluminum conductors, and many other metals or alloys, form oxides which make creating reliable ohmic connections to the conductor difficult. Further, because aluminum, and alloys of aluminum, melt at relatively low temperatures, subsequent processing of an integrated circuit structure after deposition of aluminum is necessarily limited. To overcome these and other disadvantages of aluminum interconnections, metal silicides are being increasingly studied as an alternative means of providing a high conductivity metallization system in integrated circuit structures. A recent publication indicative of this interest is "Refractory Silicides for Low Resistivity Gates and Interconnects" by S. P. Murarka, Technical Digest of the 1979 International Electron Devices Meeting, Washington, D.C., Dec. 3–5, 1979.

SUMMARY OF THE INVENTION

This invention provides a multilayer metal silicide interconnection process and structure which offers significant advantages over prior art processes and structures. Because of its high melting point, the refractory metal silicide structure of this invention is resistant to electromigration. Refractory metal silicides are stable at high temperatures allowing deposition and subsequent melting of phosphorous doped vapox. Because metal silicide interconnections are formed by the chemical reaction between a chosen metal, typically a refractory metal, and silicon, the need to clean an interface where a metal silicide connection will be made is lessened.

In one embodiment, a method of fabricating an electrical connection between two conducting layers in an integrated circuit structure comprises: forming a first conducting layer of a metal silicide on the integrated circuit structure; depositing a layer of silicon on the surface of the first conducting layer; and depositing a layer of silicide forming metal on selected regions of the layer of silicon to thereby form regions of metal silicide at the selected regions. The first conducting layer of metal silicide typically is formed by depositing a first layer of polycrystalline silicon and then a layer of a refractory metal such as tungsten. As the tungsten is deposited, for example by chemical vapor deposition, the tungsten reacts with the underlying silicon to form tungsten silicide. A layer of polycrystalline silicon is then formed on the surface of the tungsten silicide. Next, regions of insulating material are formed over selected portions of the polycrystalline silicon and a metal layer is deposited on the surface of the insulating material and on the surface of the polycrystalline silicon where insulating material has not been formed or has been removed. The metal reacts with the unprotected polycrystalline silicon to form a metal silicide in the openings in the insulating material. These regions of metal silicide serve to interconnect the underlying layer of metal silicide with the upper layer of metal or metal silicide. In some embodiments of the invention a layer of polycrystalline silicon is deposited over the surface of the upper layer of metal to convert any remaining metal to metal silicide and to prevent peeling of the upper metal silicide layer.

DETAILED DESCRIPTION

Figure 1:
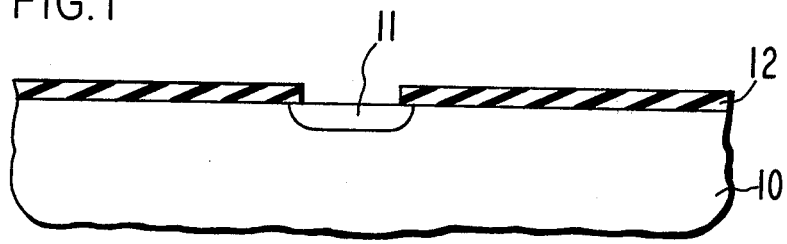
FIG. 1 is a cross-sectional view of an integrated circuit structure prior to fabrication of any conducting layers.

A cross-sectional view of an integrated circuit structure formed using conventional prior art techniques is shown in FIG. 1. As shown the structure includes a silicon semiconductor substrate 10 having a selected region 11 to which an ohmic electrical connection is desired. A layer of silicon dioxide 12 or other insulating material has been formed across the upper surface of substrate 10 to prevent electrical connections to regions other than region 11. Typically oxide 12 will be 2000 to 4000 angstroms thick, and may be created by heating substrate 10 to approximately 1100° C. for four hours in dry oxygen.

Figure 2:
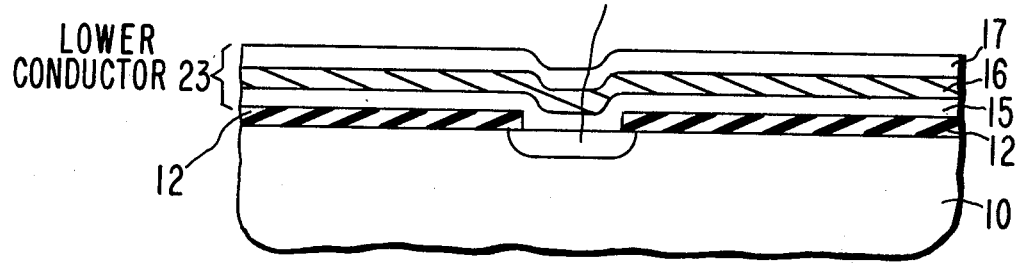
FIG. 2 is a view of the same cross section showing the appearance of the structure after a first layer of polycrystalline silicon has been deposited, a first layer of metal silicide formed, and a second layer of polycrystalline silicon deposited.

Next, as shown in FIG. 2, a layer of polycrystalline silicon 15 is deposited across the surface of oxide 12 and region 11. In the preferred embodiment, polycrystalline silicon layer 15 is 3000 angstroms thick and formed using well-known chemical vapor deposition (CVD) processes. In some embodiments, layer 15, and subsequently formed layers of polycrystalline silicon, may be gettered by being lightly doped with phosphine gas, for example to create a P type impurity concentration of $10^{16}$ to $10^{17}$ atoms per cubic centimeter. A layer of metal approximately 1000 angstroms thick is deposited on layer 15 using any known chemical vapor deposition process, for example at atmospheric or subatmospheric pressure. In the preferred embodiment the metal will be a refractory metal, for example, tungsten, molybdenum, tantalum, titanium, or niobium. Any other refractory metal which reacts with silicon to form a conductive layer may also be used. As the tungsten or other metal is deposited, it will react with the polycrystalline silicon 15 to form a layer of tungsten silicide. For example, if 1000 angstroms of tungsten are deposited on 3000 angstroms of polycrystalline silicon, the resulting structure will have about a 500 angstrom thick layer of polycrystalline silicon beneath about a 2500 angstrom thick layer of tungsten silicide. The layer of tungsten silicide is designated 16 in FIG. 2, although it will be understood that layer 16 may be any metal-silicon compound as described above. Following the formation of the tungsten silicide layer 16, approximately a 1000 angstrom thick layer of polycrystalline silicon 17 is deposited on the upper surface of silicide layer 16, for example, using known CVD technology. The combination of layers 15, 16, and 17 forms a lower conductor 23 connected to region 11.

Figure 3:
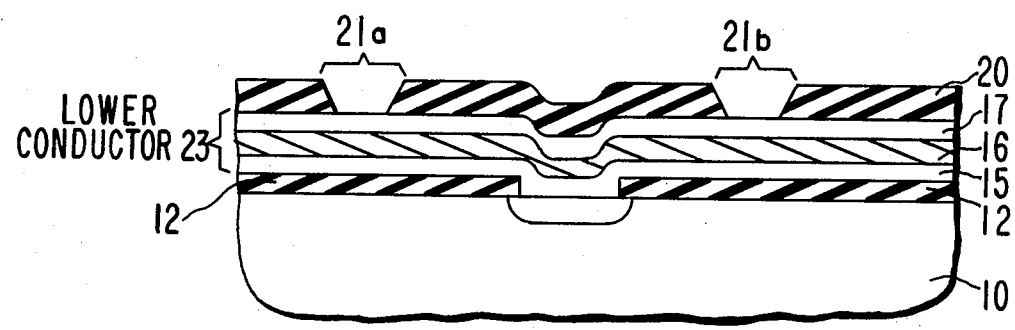
FIG. 3 is a view of the same cross section following formation of insulating material over selected portions of the second layer of polycrystalline silicon.

As shown in FIG. 3, a layer 20 of silicon dioxide or other suitable insulating material is then formed across the surface of polycrystalline silicon layer 17. In the preferred embodiment, this insulating layer is silicon dioxide approximately 5000 to 7000 angstroms thick. Openings 21a and 21b are made in insulating layer 20 at locations where electrical contact is desired between any layer formed on the upper surface of layer 20 and the lower conductor 23. Silicon dioxide layer 20 and openings 21a and 21b in the layer 20 may be formed using known integrated circuit fabrication and photolithographic techniques. In the preferred embodiment silicon dioxide layer 20 is formed by known vapor deposition, and openings 21a and 21b are chemically etched using a 10:1 solution of hydrofluoric acid. Layer 20 may also be formed by thermal oxidation of the polycrystalline silicon 17 in steam at a relatively lower temperature, for example, 800° C. The resulting silicon dioxide layer 20 will be about 2.4 times thicker than layer 17 if all of layer 17 is permitted to oxidize. Because of the inherent difficulty in stopping the oxidation process at the proper time, this technique is not preferred.

Figure 4:
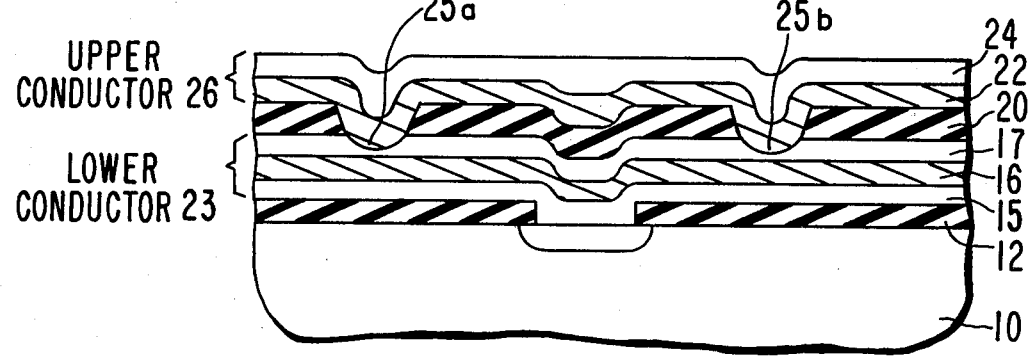
FIG. 4 is a view of the same cross section showing the appearance of the structure after formation of a second layer of metal silicide and deposition of a final layer of polycrystalline silicon.

The final processing steps to achieve the interconnections between conductor 23 and conductor 26 are shown in FIG. 4. Another layer of metal 22, chosen as described above, approximately 1000 angstroms thick, is deposited using known technology on the surface of the oxide layer 20 and on polycrystalline silicon 17 in openings 21a and 21b. In the openings where the metal 22 is allowed to contact the underlying polycrystalline silicon 17, a metal silicide will form. Elsewhere layer 22 will be substantially pure metal.

Across the upper surface of layer 22 a layer of polycrystalline silicon 24 is deposited, for example using chemical vapor deposition. Polycrystalline silicon 24 prevents peeling of the underlying silicide layer 22 and reacts with any remaining metal in layer 22 to convert all of layer 22 to metal silicide.

The combination of layers 22 and 24 forms an upper conductor 26. As shown in FIG. 4, upper conductor 26 is connected to lower conductor 23 at locations 25a and 25b. Regions 25a and 25b are known as vias, and serve to interconnect two otherwise electrically separated conducting paths, that is conductor 23 to conductor 26.

The structure of this invention provides an electrical interconnection system for integrated circuit structures which is resistant to electromigration, which is stable at high temperatures, and which is receptive to the deposition of phosphorous doped vapox. Because the interconnections between the adjoining conducting layers are created by a chemical reaction at the interface of the layers, the interconnections are, in effect, self-cleaning. This increases the yield of the product using the connections and minimizes the need to eliminate minor defects at via locations.

The structure shown in FIG. 4 is typically annealed following fabrication of polycrystalline silicon layer 24. In one embodiment, the structure is annealed for 15 to 30 minutes at 1000° C. If tungsten silicide is used to form layers 16 and 22, layers 16 and 22 in the resulting structure will have a sheet resistance of 2-2 ohms per square.

Although one embodiment of the foregoing invention has been described, it is intended that various changes or modifications may be made to the embodiment within the scope of the appended claims. For example, the process may be repeated as many times as desired to create structures having more than a lower conductor and an upper conductor. In such embodiments vias may be formed between any two desired layers. Other applications and variations will also occur to those skilled in the art without departing from the scope of the invention as defined in the appended claims.

What is claimed is:

1. A method of fabricating an electrical connection between two conducting layers in an integrated circuit structure comprising:
    forming a first conducting layer of a metal silicide on the integrated circuit structure;
    depositing a layer of silicon on the first conducting layer;
    depositing a layer of a metal which reacts with silicon on selected regions of the layer of silicon to thereby form regions of metal silicide at the selected regions.

2. A method as in claim 1 wherein prior to the step of depositing a layer of a metal a layer of insulating material is formed over all of the layer of silicon except the selected regions.

3. A method as in claim 2 wherein the layer of metal is also deposited over the insulating material.

4. A method as in claim 1 wherein the step of forming the first conducting layer is performed by depositing a layer of silicon followed by depositing a layer of metal which reacts with the layer of silicon to form the metal silicide.

5. A method as in claim 1 followed by the step of annealing to lower the resistivity of the metal silicide.

6. A method as in claim 1 wherein the layer of silicon comprises polycrystalline silicon.

7. A method as in claim 1 wherein the metal silicide is formed using one metal from the group consisting of tungsten, molybdenum, tantalum, titanium, and niobium.

8. A method as in claim 7 wherein the regions of metal silicide at the selected regions are formed using one metal from the group consisting of tungsten, molybdenum, tantalum, titanium, and niobium.

9. A method as in claim 1 followed by the step of depositing an additional layer of silicon over the layer of metal.

10. A method as in claim 9 wherein the additional layer of silicon comprises polycrystalline silicon.

11. A method as in claim 1 wherein both the metal silicide in the first conducting layer and the regions of metal silicide at the selected regions comprise the same type of metal silicide.

12. A method of fabricating an electrical connection between a first conducting layer and a second conducting layer in an integrated circuit structure comprising:

depositing a first layer of silicon on the integrated circuit structure;

depositing a first layer of metal which reacts with the first layer of silicon to form a first layer of metal silicide, the first layer of metal silicide comprising the first conducting layer;

depositing a second layer of silicon on the first layer of metal silicide;

forming regions of insulating material on the second layer of silicon; and depositing a second layer of metal to form a second layer of metal silicide wherever the second layer of metal contacts the second layer of silicon, the second layer of metal and metal silicide comprising the second conducting layer.

13. A method as in claim 12 followed by the step of depositing a third layer of silicon.

14. A method as in claim 13 followed by the step of annealing the first layer of metal silicide and the second layer of metal silicide to lower their respective resistances.

15. A method as in claim 12 wherein the silicon in the first layer and in the second layer comprises polycrystalline silicon.

* * * * *